United States Patent [19]

Toda et al.

[11] 4,417,169

[45] Nov. 22, 1983

[54] PHOTOELECTRIC DRIVE CIRCUIT FOR A PIEZOELECTRIC BIMORPH ELEMENT

[75] Inventors: Minoru Toda; Susumu Osaka, both of Machida, Japan

[73] Assignee: RCA Corporation, New York, N.Y.

[21] Appl. No.: 347,975

[22] Filed: Feb. 11, 1982

[51] Int. Cl.³ .......................................... H01L 41/08
[52] U.S. Cl. .................................. 310/317; 310/311; 310/332
[58] Field of Search ................ 310/311, 317, 330–332, 310/363, 364; 318/480; 250/200, 201, 204–206, 548, 237 G, 237 R, 215, 229; 320/61; 315/149

[56] References Cited

U.S. PATENT DOCUMENTS

| | | | |
|---|---|---|---|
| 2,054,380 | 9/1936 | Lamb | 250/206 X |
| 2,499,484 | 3/1950 | Friend | 250/206 X |
| 3,152,317 | 10/1964 | Mayer | 250/215 X |
| 3,321,632 | 5/1967 | Wood | 250/206 X |
| 3,582,658 | 6/1971 | Mita | 310/311 X |
| 3,585,416 | 6/1971 | Mellen | 310/330 X |

FOREIGN PATENT DOCUMENTS 1095042  1/1965  United Kingdom ................ 310/311

Primary Examiner—Mark O. Budd
Attorney, Agent, or Firm—Glenn H. Bruestle

[57] ABSTRACT

A photoelectric circuit arrangement includes one direct current voltage source and first and second photoconductive networks, each comprising at least one resistance and one photoconductive cell. An output voltage generated between two output terminals of the first and second networks is directly applied to a bimorph element used to close or open a blind. The strong light causes the networks to be in low resistive state so as to produce the output voltage of one polarity to bend the bimorph in one direction and thereby to tend to close the blind, while the weak light causes the networks to be in high resistive state so as to produce the output voltage of the other polarity to bend the bimorph in the opposite direction and thereby to tend to open the blind. The first and second photoconductive networks can be integrated in one body.

5 Claims, 4 Drawing Figures

PHOTOELECTRIC DRIVE CIRCUIT FOR A PIEZOELECTRIC BIMORPH ELEMENT

This invention relates to photoelectric drive circuits and, particularly, to a photoelectric circuit arrangement for driving a piezoelectric bimorph element to bend and thereby to open or close a window blind according to the quantity of transmitted light through the blind.

BACKGROUND OF THE INVENTION

As is well-known, a piezoelectric material whose polarization direction is the same as that of the electric field expands in the electric field direction and contracts in the direction perpendicular to the electric field, and a piezoelectric material whose polarization direction is opposite to that of the electric field contracts in the electric field direction and expands in the direction perpendicular to the electric field. Certain ceramic material, for example, PZT, is also known to be a piezoelectric material. A bimorph element comprising two layers of this ceramic material expands and contracts in accordance with the direction of polarization thereof, according to the polarity of an electric field applied thereto. Thus, if a bimorph element is formed of ceramic material with one end fixed to a suitable support structure, the free end moves in one direction or the other in accordance with an applied electric field.

The bending movement of a bimorph element has been used in vibration generator, vibration sensor, and electrical switching devices. In the present invention it is proposed to automatically open or close a balanced Venetian blind through the displacement of the free end of a bimorph element formed of ceramic material, with one end fixed and the element driven by an output of a photoconductive circuit. When the bending motion of a bimorph element causes a window blind to open or close, it is desirable that a large bending movement be obtained in accordance with changes of incoming light quantity and with high light sensitivity. A bimorph element should be driven by a direct current voltage source under the applicable maximum voltage which will not produce polarization inversion causing the bending sensitivity to decrease. It is disadvantageous from the point of material cost to increase a ceramic bimorph element structure in size. There is a need in the art for a photoelectric circuit arrangement which is characterized by a simple electrical arrangement, the use of only one direct current voltage source, direct driving for a bimorph element by the voltage generated between two outputs of photoconductive networks, and the capability of making a piezoelectric bimorph element to maximally bend with high light sensitivity according to the light quantity.

SUMMARY OF THE INVENTION

Only one direct current voltage source is applied to a piezoelectric bimorph element through first and second photoconductive networks, each comprising at least one resistance and one photoconductive cell. One end of the bimorph element is fixed to a supporting member, the other free end can be equipped with a mechanism to open or close, e.g., a Venetian type window blind. When all of photoconductive cells in the first and second networks are in high resistive state, an electric field of one direction is applied to the bimorph element to bend it in one direction and thereby to open the blind. When all the photoconductive cells are in low resistive state, an electric field of the opposite direction is applied to the bimorph element to bend it in the opposite direction and thereby to close the blind. The first and second photoconductive networks can be integrated on an insulating substrate as one body. The transmitted light intensity through the blind can be controlled to a constant value.

DESCRIPTION OF THE PREFERRED EMBODIMENT

Figure 1:
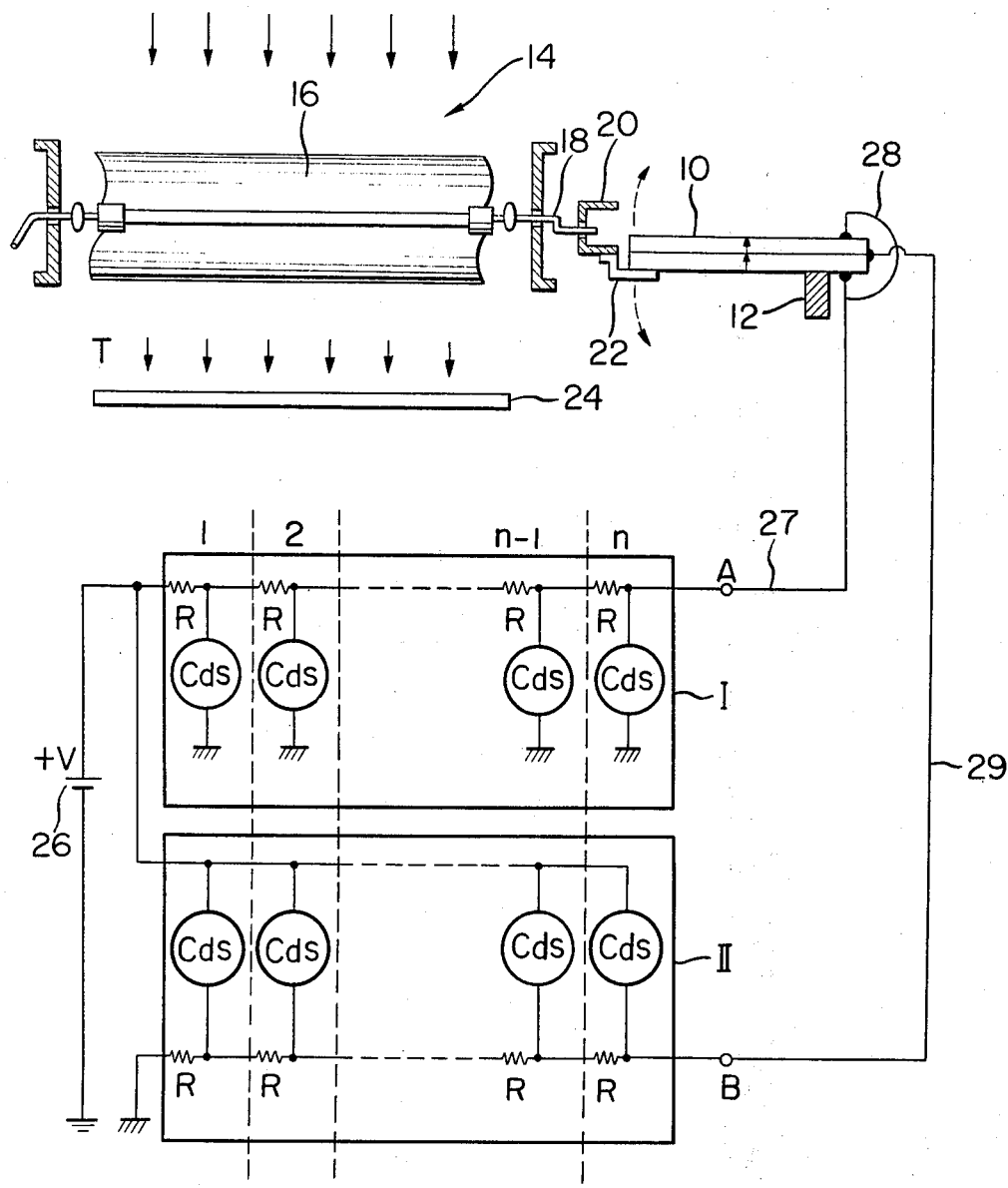
FIG. 1 shows one embodiment of the present invention.

Referring to FIG. 1, a piezoelectric bimorph 10 whose one end is fixed to a suitable support member 12 is directly driven by the voltage output of two photoconductive networks I and II to automatically open or close a window blind 14. The blind 14 is a Venetian blind with a lightweight, balanced structure. The Venetian blind 14 comprises a series of slats 16 each pivoted at its ends and provided with a crank 18. Each crank 18 is jointed by a crank drive member 20 which is an elongated channel member. The crank drive member 20 has apertures through which each crank 18 protrudes and is driven by an arm 22 which is firmly attached to the free end of the bimorph 10, and all the slats 16 move in the same manner. U.S. patent applications Ser. No. 231,856 by Osaka and Sagawa and Ser. No. 231,858 by Osaka and Toda, both filed on Feb. 5, 1981 illustrate a Venetian blind construction which may be used in the practice of the present invention.

Each of photoconductive networks I and II comprises an array of the resistors R and the photoconductive cells CdS. The resistors R and photoconductive cells CdS in the network I constitute a first resistive means and a first photoconductive means, respectively, and those in the network II constitute a second resistive means and a second photoconductive means, respectively. All of the photoconductive cells CdS in the networks I and II are illuminated by transmitted light through the blind 14 and through a light attenuator 24. The network I is composed of n-stages (1,2,3 . . . n) in cascade connection, each of which consists of a resistance and a photoconductive cell connected to each other in L-shape arrangement. In the network I, each resistance is connected to each other in series, and each photoconductive cell is connected between the output side end of each resistance and the ground. The input side end of the resistance of the first stage in the network I is connected to the positive terminal of a direct current voltage source 26, the negative terminal of which is connected to ground. The network II is identical to the network I except that the input end of the resistance series is connected to ground and the ends of the photoconductive cells not connected to the resistances are connected to the positive voltage terminal. Each output of the networks I and II is derived from a connecting point between the resistance and the photoconductive cell of the last stage. The value V of the direct current voltage source is chosen under the applicable maximum voltage to the bimorph element 10 not to cause polarization inversion.

In FIG. 1, the bimorph element 10 comprises two ceramic material layers having the same polarization, for example, orthogonal to the electrode surface (not shown) coated on opposite sides of each layer, as shown by a solid arrow indicating the direction of polarization of the layers. The output terminal A of the network I is connected to the outer electrodes of each layer composing the bimorph element by conductors 27 and 28. The output terminal B of the network II is connected to the inner electrodes of each layer composing the bimorph element 10 by conductor 29. Therefore, an electric field of the opposite direction is applied to each of the layers having the same polarization. As is well-known, a piezoelectric material whose polarization direction is the same as that of the electric field contracts in the direction perpendicular to the electric field and a piezoelectric material whose polarization direction is opposite to that of the electric field expands in the direction perpendicular to the electric field. Thus, the bimorph element 10 can be bent in accordance with the polarity of the voltage output between the output terminals A and B as shown by a broken arrow in FIG. 1.

When all the photoconductive cells in the networks I and II are illuminated by very feeble light and the resistance Rp of each photoconductive cell is much higher than the resistance R of each resistance, little current flows through the networks I and II. At this point, almost all of the direct current voltage V is applied to each photoconductive cell. The electric potential $V_A$ of the output terminal A of the network I becomes about $+V$ volts, and the electric potential $V_B$ of the output terminal B of the network II becomes nearly zero volt. Therefore, the voltage of about V volts will be generated between output terminals A and B and applied to the bimorph element 10. The potential of $+V$ on terminal A causes the bimorph element 10 to be bent in its maximum downward position and thereby the blind 14 to be opened completely.

As the intensity of light illuminating all the photoconductive cells in the networks I and II increases, the resistance Rp of each cell decreases. The more the resistance Rp decreases, the more the current flows through the networks I and II. The electric potentials $V_A$ and $V_B$ will become lower and higher, respectively, with the increase of the current flowing through the networks I and II. Therefore, the voltage difference between output terminals A and B decreases with the increase of the current flow causing the bimorph element 10 to bend upward. The bimorph element 10 will be at a horizontal level when no voltage difference exists between output terminals A and B because of the same value of the electric potentials $V_A$ and $V_B$.

When all the photoconductive cells in the networks I and II are illuminated by considerably intense light and the resistance Rp of each cell is much lower than the resistance R, the electric potentials $V_A$ and $V_B$ become nearly zero and $+V$ volts, respectively. At this point, the voltage of V volts will be generated between output terminals A and B. The potential of $-V$ volts on terminal A compared with that of terminal B causes the bimorph element 10 to be bent in its maximum upward position and thereby the blind 14 to be closed completely. Thus, the transmitted intense light makes the blind 14 tend to close, and the transmitted feeble light makes the blind 14 tend to open so that the transmitted light intensity can be controlled to a constant value.

In FIG. 1, it is to be noted that each of the networks I and II can be composed of only one L stage. However, the light sensitivity of the system increases with the number of the stages. The voltage source 26 is divided and decreased by one section of the L-type circuit consisting of a resistance and a photoconductive cell, and further adding one more of the same L-type circuit to the output of the first L-type circuit, the output voltage is decreased more. Thus, the multistage L-type circuit produces larger output voltage change than a one stage circuit does, and as a result, the bimorph element 10 is controlled more sensitively by the change of light intensity.

Figure 2:
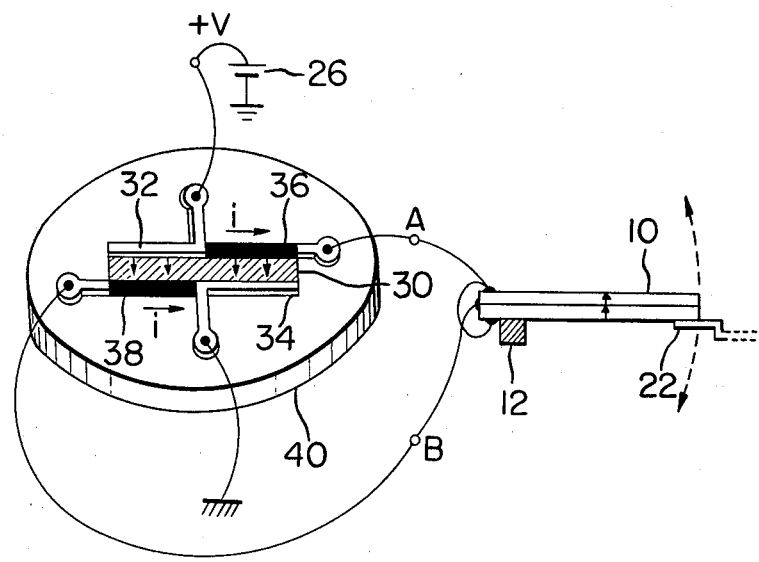
FIG. 2 shows another embodiment of the present invention.

Referring to FIG. 2, a rectangular-shaped thin photoconductive layer 30 such as a CdS layer, two long and narrow metal layers 32, 34 and two long and narrow resistive layers 36, 38 are integrated on an insulating substrate 40. Each of the metal layes 32, 34 and each of the resistive layers 36, 38 are diagonally arranged, respectively, in such a way that the metal layer 32 faces the resistive layer 38 and the metal layer 34 faces the resistive layer 36. The resistive layers 36, 38 constitute a first resistive means and a second resistive means, respectively. The photoconductive layer 30 constitutes a first photoconductive means in the right half region thereof and a second photoconductive means in the left half region thereof. Both the longitudinal sides of the photoconductive layer 30 are in contact with each of metal layers 32, 34 and resistive layes 36, 38. One end of the metal layer 32 is connected to one end of the resistive layer 36. The connecting region between the metal layer 32 and the resistive layer 36 is connected to the positive terminal of the direct current voltage source 26. A first output terminal A is derived from the other end of the resistive layer 36. One end of the resistive layer 38 is connected to one end of the metal layer 34. The connecting region between the metal layer 34 and the resistive layer is connected to the negative terminal of the direct current voltage source 26. A second output terminal B is derived from the other end of the resistive layer 38. Two output terminals A and B are connected to electrodes of the bimorph element 10 in the manner shown in FIG. 1. The photoconductive device comprising a distributed constant network shown in FIG. 2 corresponds to the case of $N = \infty$ in the embodiment composed of lumped-constant network shown in FIG. 1 and has a similar function.

When the photoconductive layer 30 is illuminated by very weak light and the resistance Rp of the half region of the layer 30 is much higher than the resistance R of each of the resistive layers 36, 38, little current flows in the resistive layers 36, 38. Therefore, the electric potentials $V_A$ and $V_B$ of the output terminals A and B become about $+V$ volts and about zero volt, respectively. The voltage of nearly V volts of one polarity will be generated between two output terminals A and B and applied to the bimorph element 10 in the same manner shown in FIG. 1. As the intensity of light illuminating the photoconductive layer 30 increases, the resistance Rp decreases causing the current i to flow in the resistive layes 36, 38 and the photoconductive layer 30. The more the current i flows in the resistive layers 36, 38, the more the electric potentials of $V_A$ and $V_B$ become lower and higher, respectively. When the photoconductive layer 30 is illuminated by strong light and the resistance Rp of the half region of the layer 30 is much lower than the resistance R of each of the resistive layers 36, 38, the electric potentials $V_A$ and $V_B$ become nearly zero volt and +V volts, respectively. Therefore, the voltage of V volts will be generated between output terminals A and B of opposite polarity and applied to the bimorph element 10.

Figure 3:
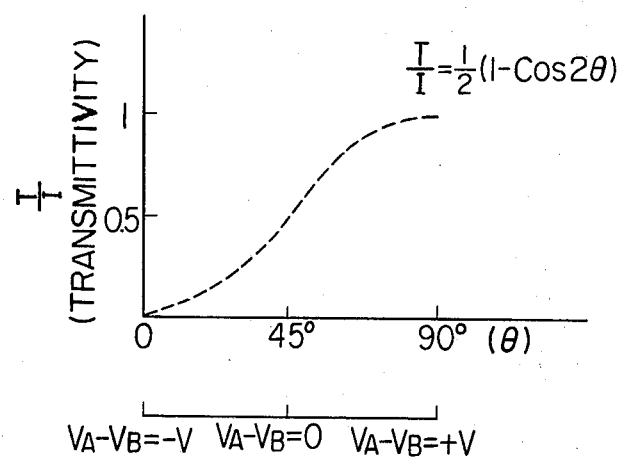
FIG. 3 shows the transmissivity for a practical window blind as a function of the angle $\theta$.
Figure 4:
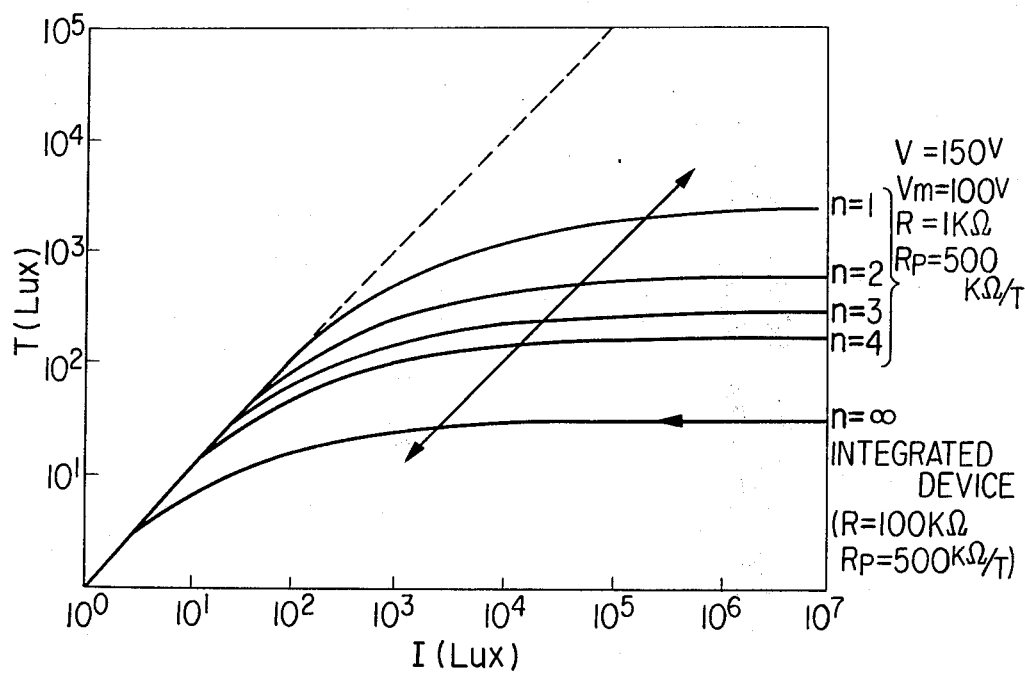
FIG. 4 shows the relation between the incident light intensity I and the transmitted light intensity T.

FIG. 3 and FIG. 4 show the relation between the incident light intensity I and the transmittted light intensity T for the case where incident light is normal to the window blind system and the illumination through the blind tends to close the blind by feedback action as shown in FIG. 1.

FIG. 3 shows the transmissivity defined T/I measured for a practical window blind as a function of a slat angle $\theta$ of the blind. As shown in FIG. 3, the characteristic was not linear but, instead, was close to the curve $\frac{1}{2}(1-\cos 2\theta)$.

FIG. 4 shows the relation between the incident light intensity I and the transmitted light intensity T calculated for n=1, 2, 3, 4, and the integrated scheme shown in FIG. 2, wherein n is a number of multi-stage section.

In the calculation, the following parameters were used. The value V of the direct current voltage source 26 is 150 volts. The value of $\pm V_m$, at which the blind completely closes or opens, is 100 volts. The resistance R=1 K$\Omega$ is used for the multi-stage circuit, and R=100 K$\Omega$ for the integrated device. From FIG. 4, for a wide range of I, the transmitted light T can be controlled to a constant value. When R is changed, the curve can be shifted up or down without changing the shape of the curve. For example, if R is increased by one order, the curve goes down by one order in a direction parallel to the dotted line. If a light attenuator 24 of 1/10 attenuation is inserted (FIG. 1), all the curves go up by one order along the dotted line. Accordingly, the light level to which the transmitted light should be kept constant can be changed. The light attenuator 24 has to be changed by manual control to adjust the particular constant light level desired.

What is claimed is:

1. A photoelectric circuit arrangement for driving a piezoelectric bimorph element comprising:
    a direct current voltage source having first and second terminals,
    a first resistive means connected beween said first source terminal and a first output terminal,
    a first photoconductive means connected between said second source terminal and distributed points along said first resistive means,
    a second resistive means connected between said second source terminal and a second output terminal,
    a second photoconductive means connected between said first source terminal and distributed points along said second resistive means, and
    means connecting said first and second output terminals to said bimorph element.

2. A photoelectric circuit arrangement for driving a piezoelectric bimorph element comprising:
    a first plurality of resistances connected in series between a first terminal of a direct current voltage source and a first output terminal,
    a first plurality of photoconductive cells, each of which is connected between a second terminal of the direct current voltage source and an output side end of a different one of said first resistances,
    a second plurality of resistances connected in series between said second terminal of the direct current voltage source and a second output terminal,
    a second plurality of photoconductive cells, each of which is connected between said first terminal of the direct current voltage source and an output side end of a different one of said second resistances, and
    means for directly applying the voltage generated between said first and second output terminals to said bimorph element.

3. A photoelectric circuit arrangement as claimed in claim 2, wherein each of said photoconductive cells is a CdS and said bimorph element is constructed of ceramic.

4. A photoelectric device integrated on an insulating substrate for driving a piezoelectric bimorph element comprising:
    one end of a first metal layer connected to one end of a first resistive layer,
    a connecting portion between said first metal layer and said first resistive layer connected to one terminal of a direct current voltage source,
    the other end of said first resistive layer being connected to a first output terminal,
    one end of a second metal layer connected to one end of a second resistive layer,
    a connecting portion between said second metal layer and said second resistive layer connected to the other terminal of the direct current voltage source,
    the other end of said resistive layer being connected to a second output terminal,
    a photoconductive layer disposed between and in contact with said first metal layer and said second resistive layer and also between and in contact with said second metal layer and said first resistive layer, and
    means for directly applying the voltage generated between said first and second output terminals to said bimorph element.

5. A photoelectric device as claimed in claim 4, wherein said photoconductive layer is a thin CdS layer and said bimorph element is constructed of ceramic.

* * * * *